(12) United States Patent
Chen

(10) Patent No.: US 7,898,279 B2
(45) Date of Patent: Mar. 1, 2011

(54) CIRCUIT FOR MULTI-PADS TEST

(75) Inventor: Yin Che Chen, Kaohsiung (TW)

(73) Assignee: Sitronix Technology Corp, Hsinchu County (TW)

( * ) Notice: Subject to any disclaimer, the term of this patent is extended or adjusted under 35 U.S.C. 154(b) by 50 days.

(21) Appl. No.: 12/113,962

(22) Filed: May 2, 2008

(65) Prior Publication Data

US 2009/0243639 A1    Oct. 1, 2009

(30) Foreign Application Priority Data

Mar. 25, 2008   (TW) ................................ 97110633 A

(51) Int. Cl.
*G01R 31/28*      (2006.01)
(52) U.S. Cl. .................................... 324/763.01
(58) Field of Classification Search ............... 324/158.1, 324/760–765; 257/46–47, 299, 90; 365/201; 327/530–537
See application file for complete search history.

(56) References Cited

U.S. PATENT DOCUMENTS

2008/0106957 A1*   5/2008   Park ............................... 365/201
2008/0265928 A1*  10/2008   Tsuchiya ....................... 324/763

* cited by examiner

*Primary Examiner* — Ha Tran T Nguyen
*Assistant Examiner* — Trung Q Nguyen
(74) *Attorney, Agent, or Firm* — Ming Chow; Sinorica, LLC

(57) ABSTRACT

The present invention relates to a circuit for multi-pads test, which is used for testing a plurality of pads. The circuit comprises one or more testing circuits, a plurality of testing switches, and a plurality of pad switches. The plurality of testing switches is coupled between the testing circuits and the plurality of pads, respectively; the plurality of pad switches is coupled between the pads, respectively. Thereby, by coordination of the plurality of pad switches and the plurality of testing switches, the number of testing probes of the testing apparatus for testing the pads can be reduced, the design difficulty of the testing apparatus can be reduced, and thus the costs can be reduced.

15 Claims, 16 Drawing Sheets

CIRCUIT FOR MULTI-PADS TEST

FIELD OF THE INVENTION

The present invention relates generally to a circuit for testing, and particularly to a circuit for multi-pads test, applied to testing a plurality of pads in integrated circuits.

BACKGROUND OF THE INVENTION

Modern semiconductor fabrication processes are well developed. The excellent technologies of semiconductor processes make the applications of integrated circuits widespread increasingly. People's most electronic products adopt integrated circuits as the core device for controlling the electronic products. Thanks to semiconductor processes, the area of integrated circuits is smaller increasingly, which makes the sizes of the electronic products, such as MP3 players, notebook computers, and digital cameras, smaller accordingly. Because of fine and delicate semiconductor processes, thousands of chips can be fabricated on a wafer. In addition, because the integrated circuit chips are very small, testers cannot perform testing by naked eyes or hands. Consequently, many testing equipments and methods are developed nowadays for testing integrated circuit chips. For example, the pad test of integrated circuit chips performs test on the pads used for wiring in integrated circuit chips. Thereby, the integrated circuit chips with malfunctioning pads will not be packaged and shipped, products with flaws will be avoided, and the brand images of the manufacturing firms of the integrated circuits can be enhanced.

FIG. 1 and FIG. 2 show schematic diagrams of multi-pads test in integrated circuits by a testing apparatus according to the prior art. As shown in the figures, the method of multi-pads test in integrated circuits according to the prior art adopts a testing port 102, wherein a plurality of testing probes 104 are set (as shown in FIG. 3), installed in a testing apparatus 10. The testing apparatus 10 is set in a testing machine (not shown in the figures) with a wafer 20 under test loaded therein. The wafer 20 comprises a plurality of integrated circuit chips 22. When the testing machine tests the integrated circuit chips 22 of the wafer 20, the wafer 20 is moved. Thereby, each integrated circuit chip 22 of the wafer 20 can be aligned with the testing port 102 of the testing apparatus 10 sequentially for the testing probes 104 of the testing port 102 to couple with each of the pads 222 on the integrated circuit chip 22, respectively.

The testing apparatus 10 can transmit a testing signal to the pads 222 of the integrated circuit chip 22 via the plurality of testing probes 104 and to testing circuits 224, respectively. Thereby, by detecting the output signal of an output terminal 226 of the testing circuit 224 in the integrated circuit chip 22, whether the pad 222 can transmit signals normally can be known. That is, by inputting testing signals to the pads 222, when the output signals are detected in the output terminals 226, it means that the integrated circuit chip 22 can transmit signals normally, the test is passed, and the pads 222 of the integrated circuit chip 22 can function normally. When the plurality of pads 222 and the plurality of testing circuits 224 maintain normal electrical coupling, the output terminals 226 of the integrated circuit chip 22 can output the output signals corresponding to the testing signals, which means the plurality of pads 222 functions normally. On the contrary, when one of the plurality of output terminals 226 corresponding to the plurality of pads 222 cannot output signals, it means that one of the plurality of pads 222 operates abnormally. Thereby, whether the pads 222 of the integrated circuit chip 22 function normally can be tested.

However, given the semiconductor fabrication processes are finer increasingly, the number of pads increases accordingly. Besides, in order to maximize productivity by increasing number of integrated circuit chips in a fixed area, the size of pads becomes smaller and denser. Because the number of testing probes of the testing apparatus according to the prior art needs to be equal to the number of pads in a single integrated circuit chip, the number of testing probes of the testing apparatus according to the prior art has to increase and the distribution of the pads had to be denser as well for corresponding to the locations of the pads. As a result, the circuit of the testing apparatus becomes more complicated, making the design of the testing apparatus difficult. Furthermore, an increase in the density of the testing probes results in a raise in the cost of the testing apparatus.

Accordingly, the present invention provides a circuit for multi-pads test, which not only can improve the drawbacks of traditional pad testing by decreasing the number of the testing probes, but also can enhance the reliability of pad testing.

SUMMARY

An objective of the present invention is to provide a circuit for multi-pads test, which uses testing switches as well as pad switches to reduce the number of testing probes. Thereby, a plurality of pads can be tested, the difficulty and cost of the design of the testing apparatus can be reduced, and the testing reliability is enhanced.

Another objective of the present invention is to provide a circuit for multi-pads test, which uses testing switches as well as pad switches to make each pad be coupled to the testing circuit by turns. Thereby, each pad can be tested accordingly. Besides, the number of testing circuits can be reduced, and the area and cost of setting the testing circuits can be decreased.

The present invention provides a circuit for multi-pads test, which is used for testing a plurality of pad. The circuit comprises one or more testing circuits, a plurality of testing switches, and one or more pad switches. The plurality of testing switches is coupled to the testing circuits and the plurality of pads, respectively. The pad switches are coupled between the pads. In addition, a testing apparatus has a plurality of testing probes. One of the testing probes contacts with one of the pads. The testing probe transmits a testing signal to the pad. The testing signal is transmitted from the pad coupled with the testing probe via the coupled testing switch to the testing circuit. Alternatively, the testing signal is transmitted from the pad coupled with the testing probe via one or more pad switches, one or more pads, and another testing switch to the testing circuit. Thereby, the testing signal is output from the output terminal of the testing circuit. If the testing circuit does not output the testing signal, it means that the corresponding pad does not operate normally. Consequently, according to the present invention, by using the testing switches and the pad switches, a single testing probe can test more pads by coupling to a pad. Hence, the number of testing probes can be reduced, and the design difficulty and the testing cost of the testing apparatus can be decreased.

DETAILED DESCRIPTION

In order to make the structure and characteristics as well as the effectiveness of the present invention to be further understood and recognized, the detailed description of the present invention is provided as follows along with preferred embodiments and accompanying figures.

According to the present invention, all connection ports of an integrated circuit chip are grouped into a plurality of connection port sets. A single testing probe is needed for each set of the connection ports sets to test all the connection ports of the connection port set. Thereby, the objective of reducing the number of testing probes can be achieved. In the following, the features of the present invention are described in some preferred embodiments.

Figure 1:
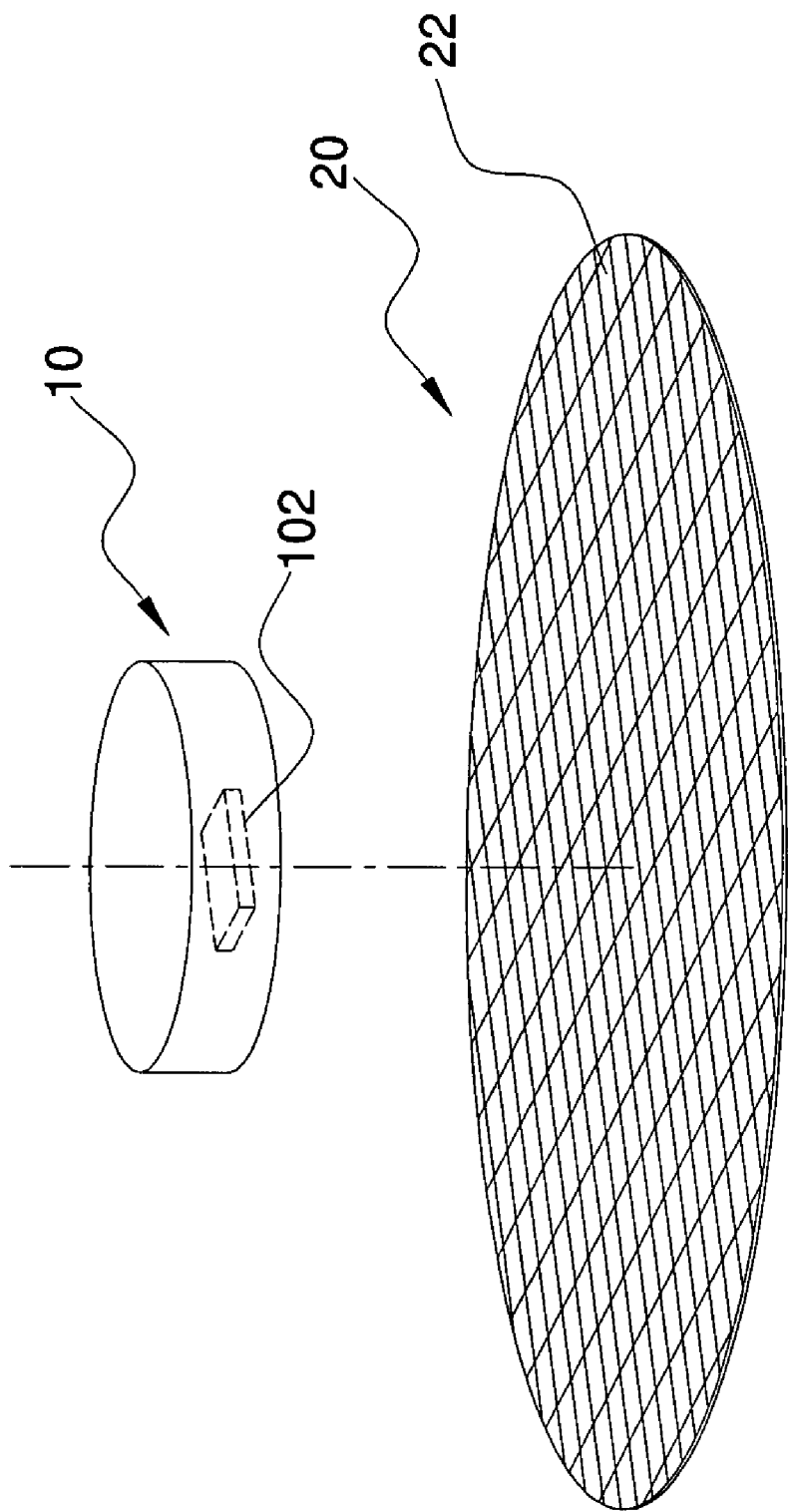
FIG. 1 shows a schematic diagram of multi-pads test in integrated circuits by a testing apparatus according to the prior art.
Figure 2:
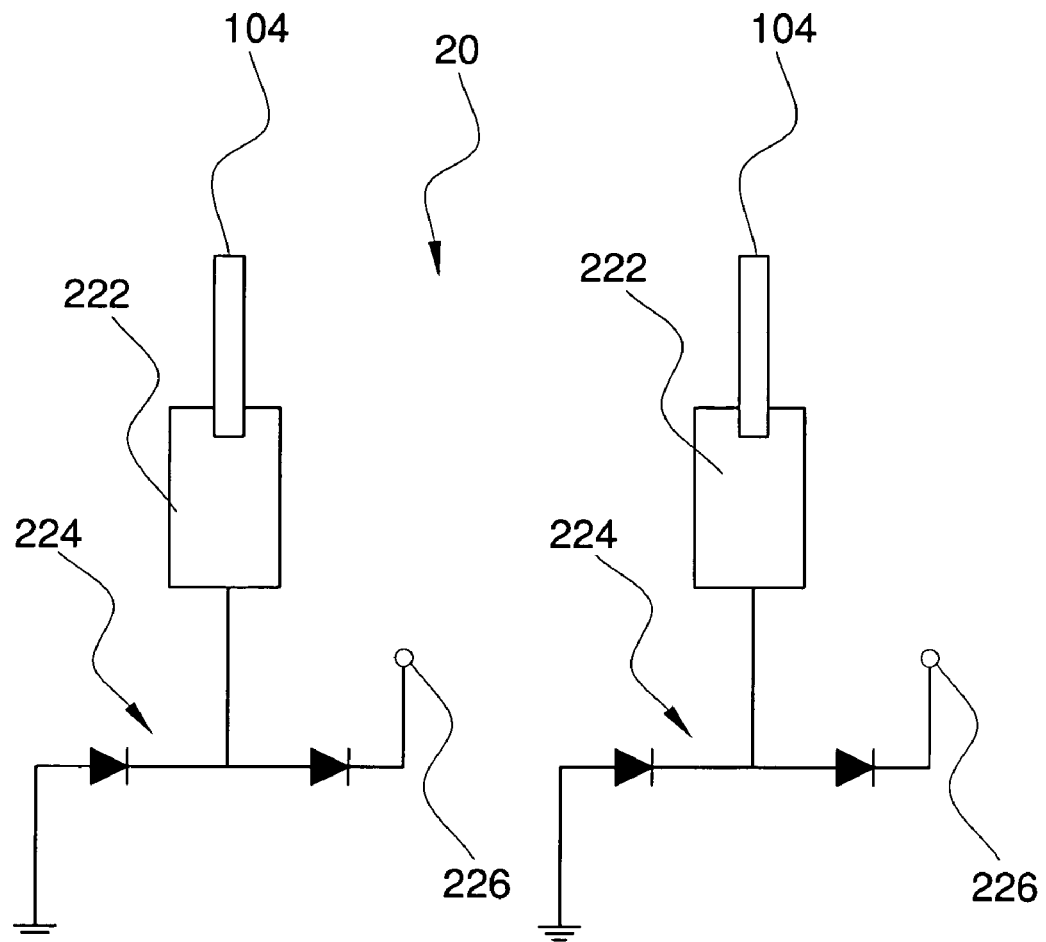
FIG. 2 shows a schematic diagram of multi-pads test according to a preferred embodiment of the prior art.
Figure 3:
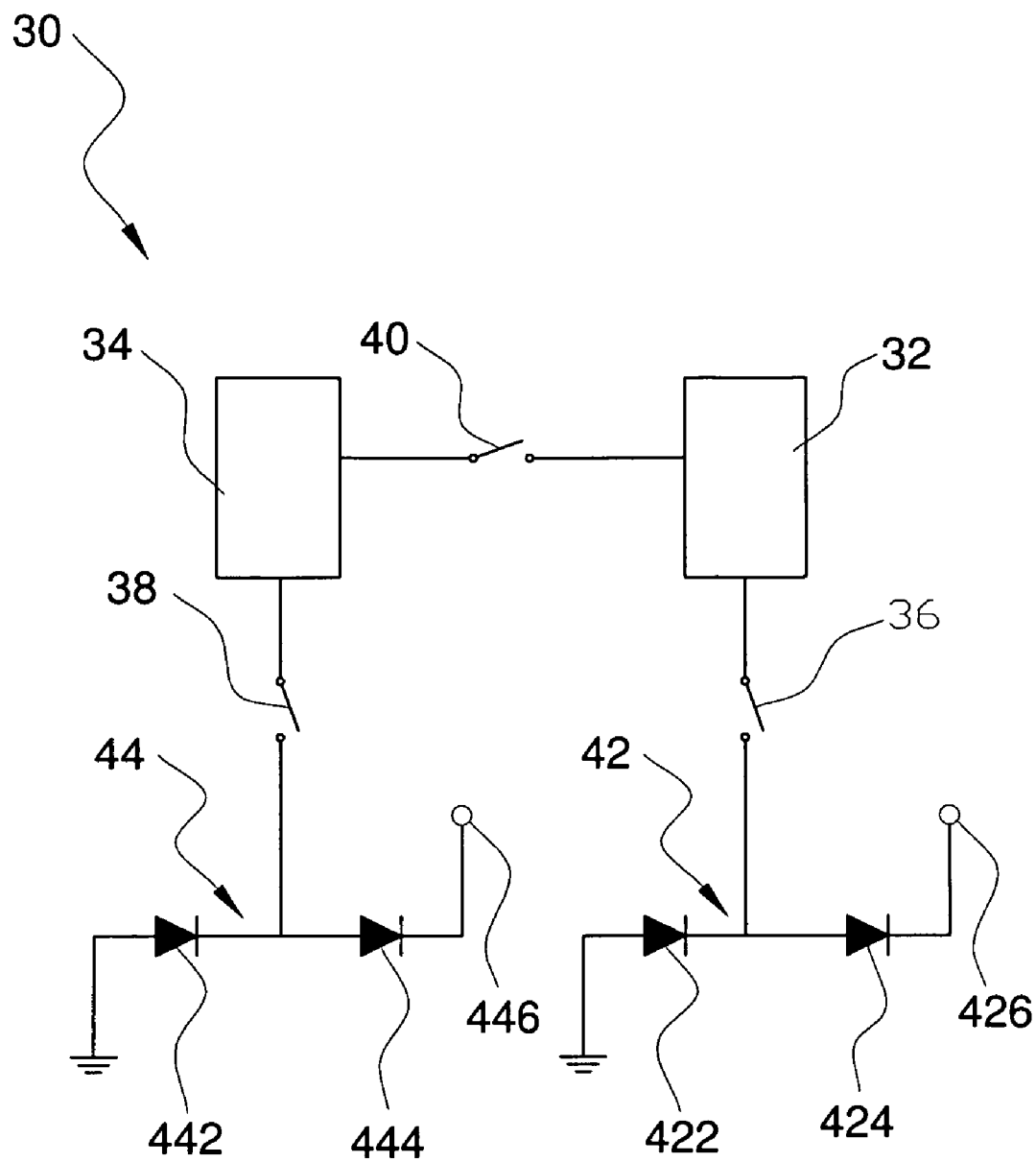
FIG. 3 shows a circuit according to a preferred embodiment of the present invention.

FIG. 3 shows a circuit according to a preferred embodiment of the present invention. According to the present preferred embodiment, two pads 32, 34 in an integrated circuit chip are grouped into a connection set. As shown in the figure, the circuit 30 used for testing a first pad 32 and a second pad 34 comprises a first testing switch 36, a second testing switch 38, a pad switch 40, a first testing circuit 42, and a second testing circuit 44. The first testing switch 36 is coupled between the first pad 32 and the first testing circuit 42; the second testing switch 38 is coupled between the second pad 34 and the second testing circuit 44; the pad switch 40 is coupled between the first and the second pads 32, 34. The first testing circuit 42 comprises a first diode 422, a second diode 424, and an output terminal 426. One terminal of the first diode 422 is coupled to the ground; the second diode 424 is coupled between the other terminal of the first diode 422 and the output terminal 426. The first testing switch 36 is coupled between the first and the second diodes 422, 424. The second testing circuit 44, as the first testing circuit 42, comprises a first diode 442, a second diode 444, and an output terminal 446. One terminal of the first diode 442 is coupled to the ground; the second diode 444 is coupled between the other terminal of the first diode 442 and the output terminal 446. The second testing switch 38 is coupled between the first and the second diodes 442, 444. A preferred embodiment of the first testing switch 36, the second testing switching 38, and the pad switch 40 in the description above is a transistor, such as a Metal-Oxide-Semiconductor Field-Effect Transistor (MOSFET). Besides, according to another preferred embodiment of the testing circuits 42, 44, the second diodes 424, 444 are omitted. That is, the first diodes 422, 442 of the testing circuits 42, 44 are coupled between the output terminals 426, 446 and the ground.

Figure 4:
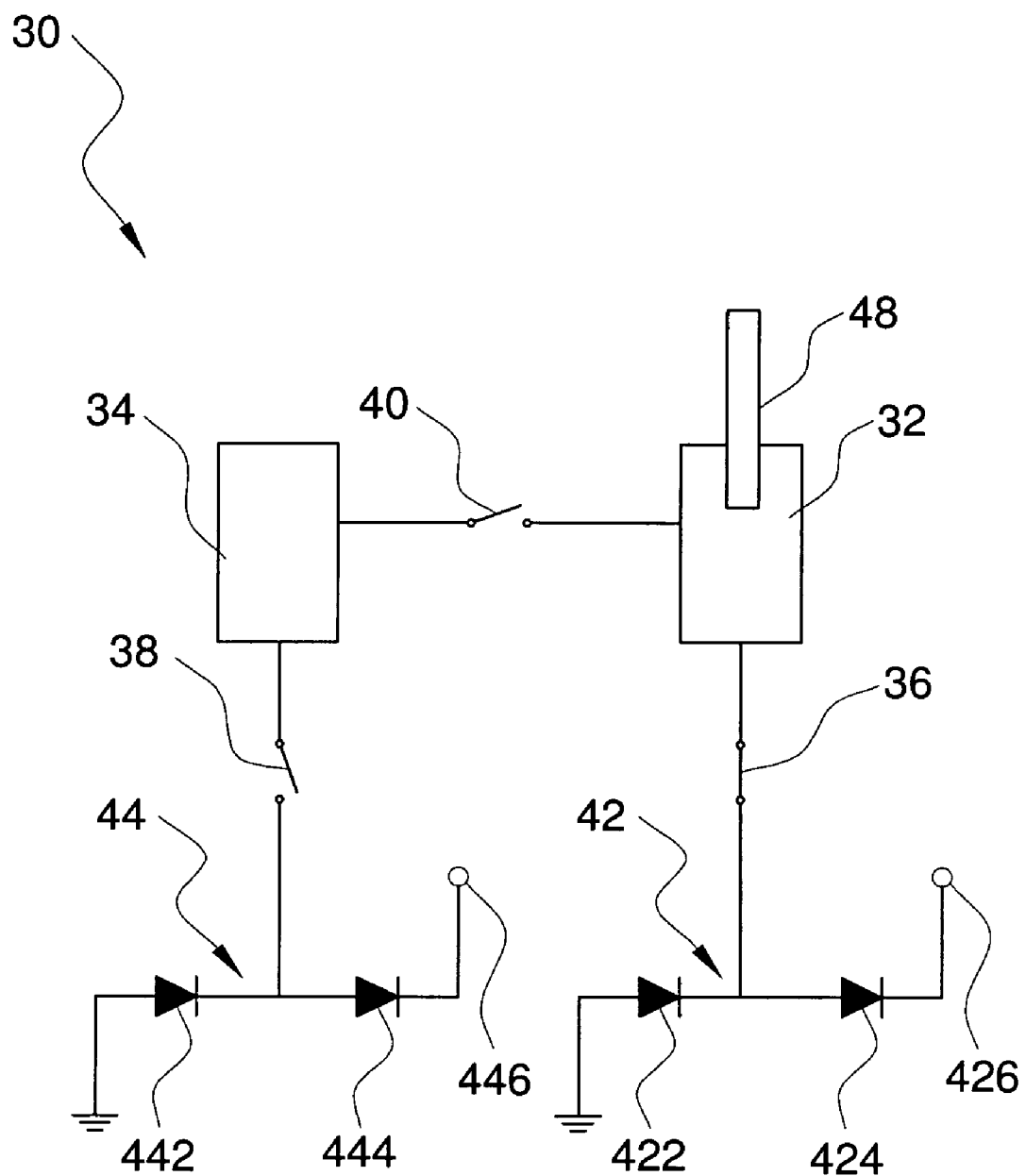
FIG. 4A shows a schematic diagram of testing the first pad of FIG. 3.
FIG. 4B shows a schematic diagram of testing the second pad of FIG. 3.
Figure 4:
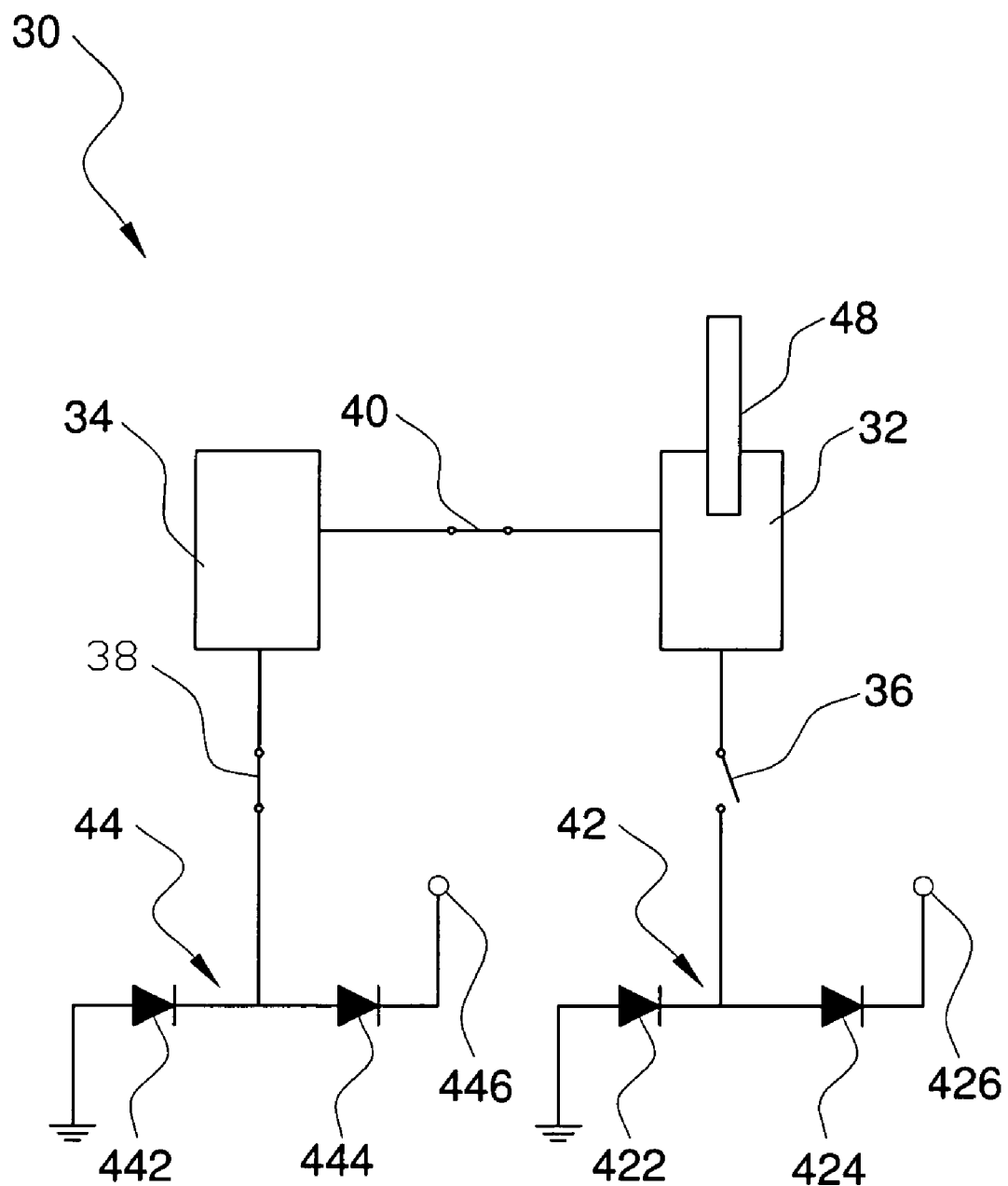

FIGS. 4A and 4B show schematic diagrams of testing the pads of FIG. 3. As shown in FIG. 4A, when testing the first pad 32, one testing probe 48 of the testing port of the testing apparatus will contact with the first pad 32. At this time, the first testing switch 36 is on; the second testing switch 38 and the first pad switch 40 are off. Thereby, the first pad 32 is coupled to the first testing circuit 42 via the first testing switch 38. The testing signal output by the testing probe 48 will be transmitted to the first testing circuit 42 via the first pad 32 and the first testing switch 36. Hence, the testing signal will pass the second diode 424, and output an output signal at the output terminal 426 of the first testing circuit 42. Accordingly, by detecting if the output signal is output at the output terminal 426, whether the first pad 32 functions normally can be known.

After testing the first pad 32 as shown in FIG. 4A, the second pad 34 is tested as shown in FIG. 4B. At this time, the first testing switch 36 will be off, and the second testing switch 38 and the first pad witch 40 will be on. Thereby, the first pad 32 will be coupled to the second testing circuit 44 via the first pad switch 40, the second pad 34, and the second testing switch 38. That is, the testing signal output by the testing probe 48 will be transmitted to the second testing circuit 44 via the first pad 32, the first pad switch 40, the second pad 34, and the second testing switch 38. Because the testing signal has to pass the second pad 34 before it can be transmitted to the second testing circuit 44, whether the second pad 34 is normal can be known by detecting if the output terminal 446 of the second testing circuit 44 can output the output signal or not. Hence, according to the present invention, by using the testing probe 48 coupled to the first pad 32 only, the second pad 34 can be tested as well, without the need of using another testing probe to test the second pad 34, reducing the number of testing probes. For example, if an integrated circuit chip has 256 pads for connecting to external circuits, according to the prior art, 256 testing probes are needed to contact those pads. However, according to the present invention, the 256 pads of the integrated circuit chip can be grouped into 128 connection port sets with two pads and the circuit 30 described above in each set. For each connection port set, by means of the circuit 30, only one testing probed is needed to test the two pads. Thereby, only 128 testing probes are needed to test the 128 sets of circuits according to the present invention. Consequently, the present invention reduces the number of testing probes contacting the pads for the testing apparatuses, thus reducing the design difficulty and the cost of the testing apparatuses.

Besides, the on/off of the testing switches 36, 38 and the pad switch 40 described above are controlled by external commands, for example, by the testing machine, to the integrated circuit chip. This is a common testing technique, and will not be described in detail.

Figure 5:
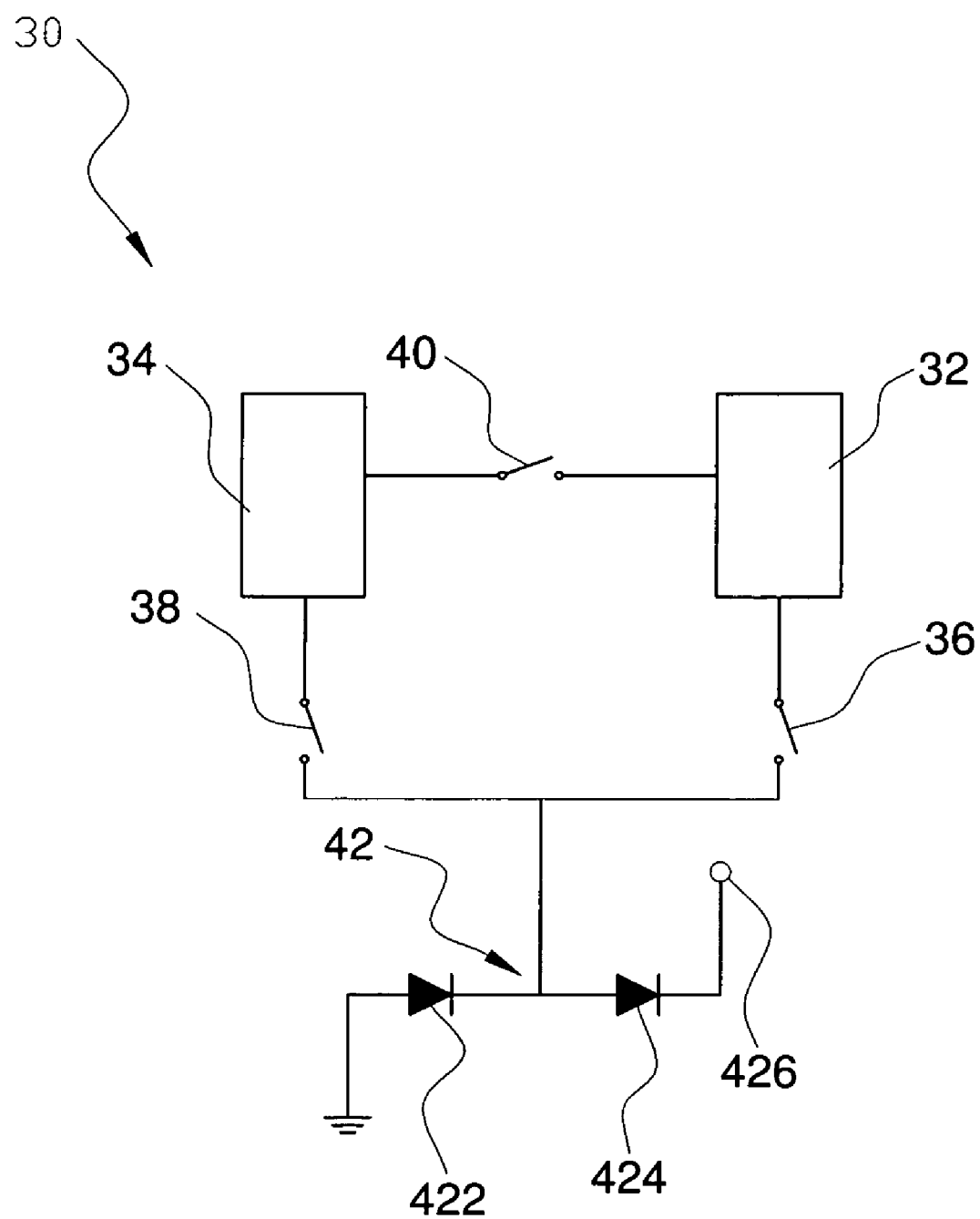
FIG. 5 shows a circuit according to another preferred embodiment of the present invention.
Figure 6:
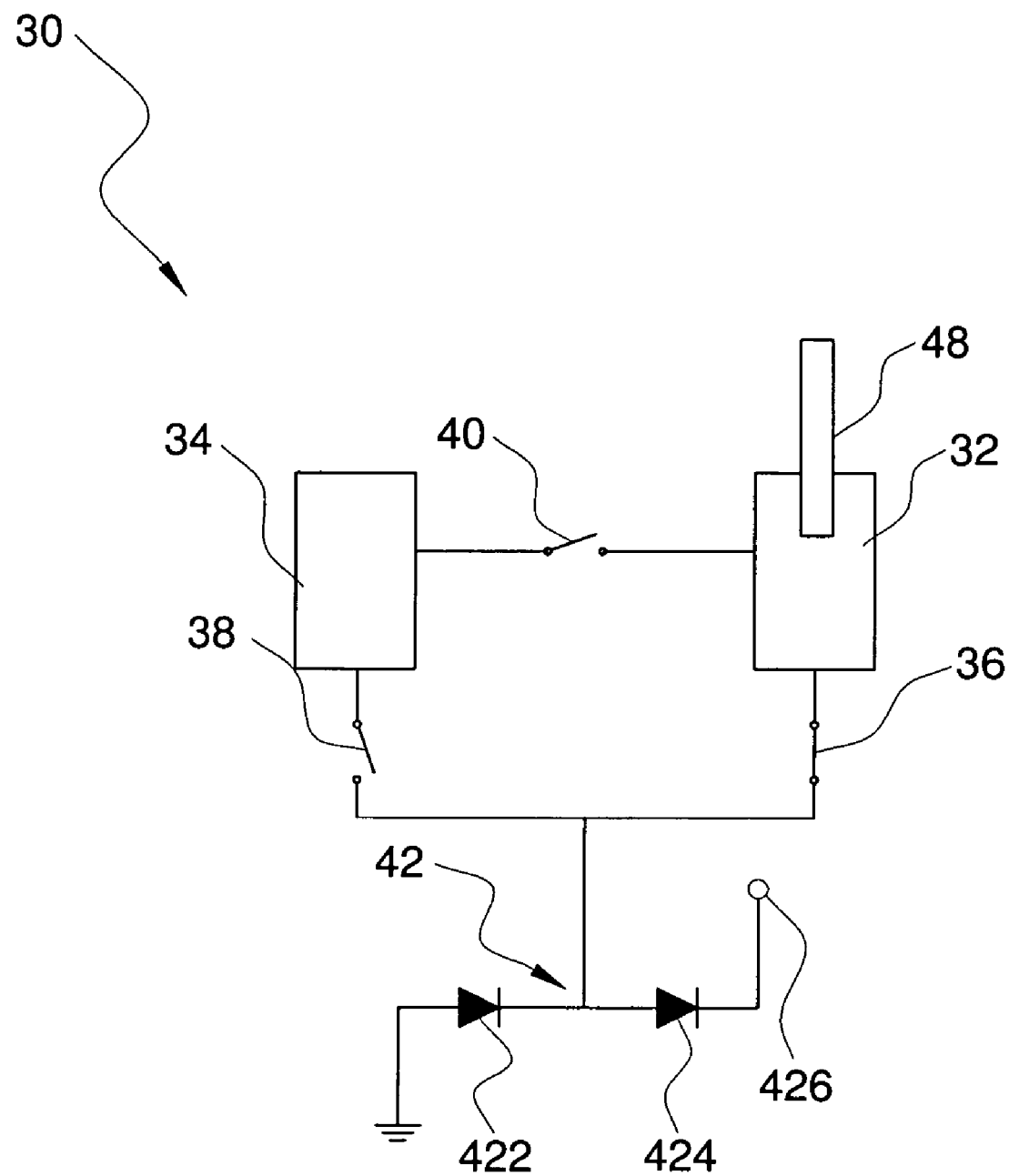
FIG. 6A shows a schematic diagram of testing the first pad of FIG. 5.
FIG. 6B shows a schematic diagram of testing the second pad of FIG. 5.
Figure 6:
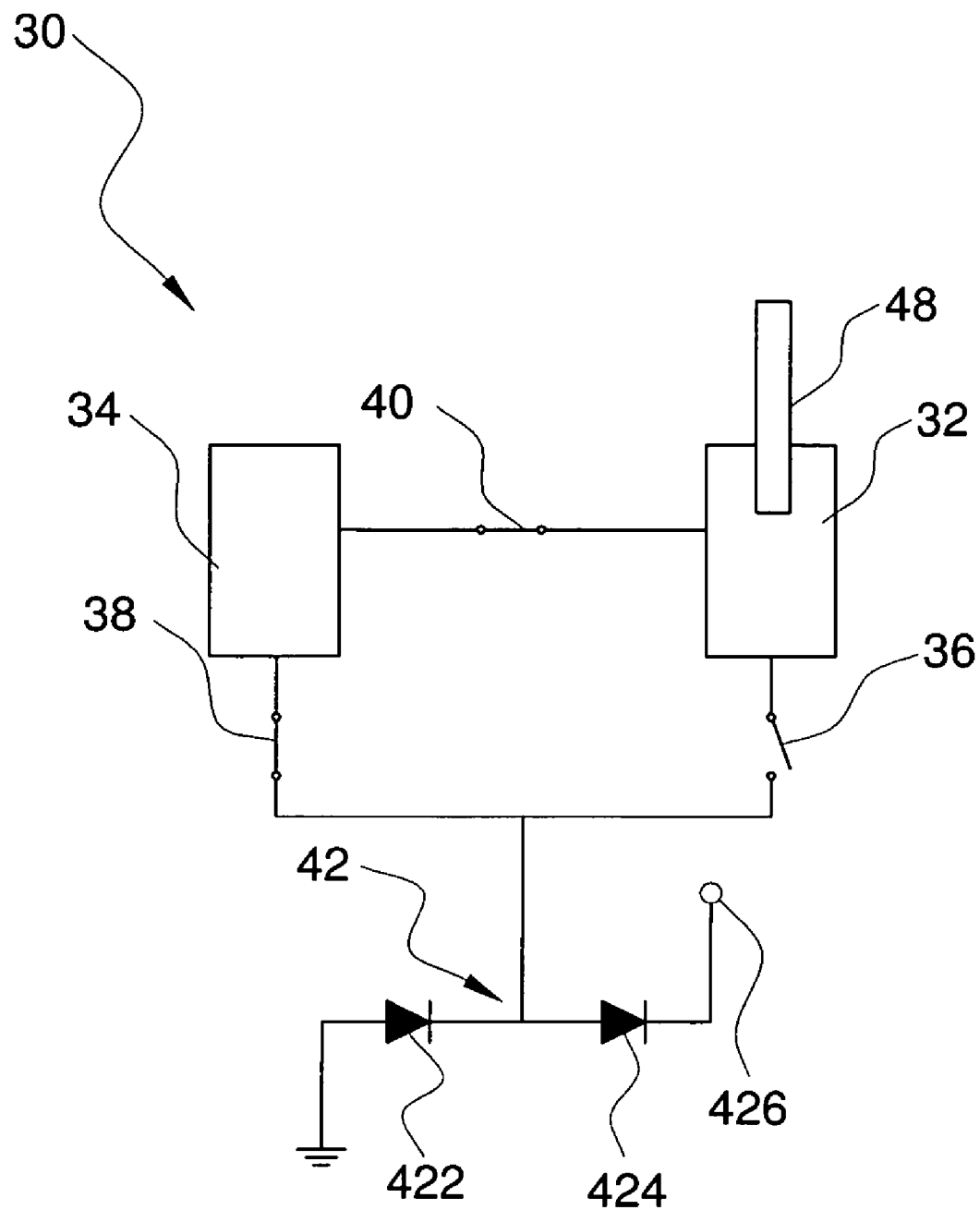

FIG. 5 shows a circuit according to another preferred embodiment of the present invention. The difference between FIG. 3 and FIG. 5 is that the circuit 30 in FIG. 5 combines the testing circuits for testing the first and the second pads 32, 34. That is, the testing circuits are combined to the first testing circuit 42 for testing the first and the second pads 32, 34. First, when testing the first pad 32, as shown in FIG. 6A, the testing probe 48 contacts the first pad 32. At this time, the first testing switch 36 is on, and the second testing switch 38 and the first pad switch 40 are off. Then the testing signal is transmitted to the first testing circuit 42 via the first pad 32 and the first testing switch 36. After the first pad 32 in FIG. 6A is tested, the second pad 34 is tested as shown in FIG. 6B. The testing probe 48 continues to be coupled with the first pad 32. At this time, the second testing switch 38 and the first pad switch 40 are on, and the first testing switch 36 is off. The testing signal is transmitted to the first testing circuit 42 via the first pad 32, the first pad switch 40, the second pad 34, and the second testing switch 38. According to the present preferred embodiment, in addition to reducing the number of testing probes, a plurality of testing switches can be coupled to the same testing circuit to reduce the number of testing circuits. Thereby, the occupied area of the testing circuits is reduced, thus reducing cost further.

Figure 7:
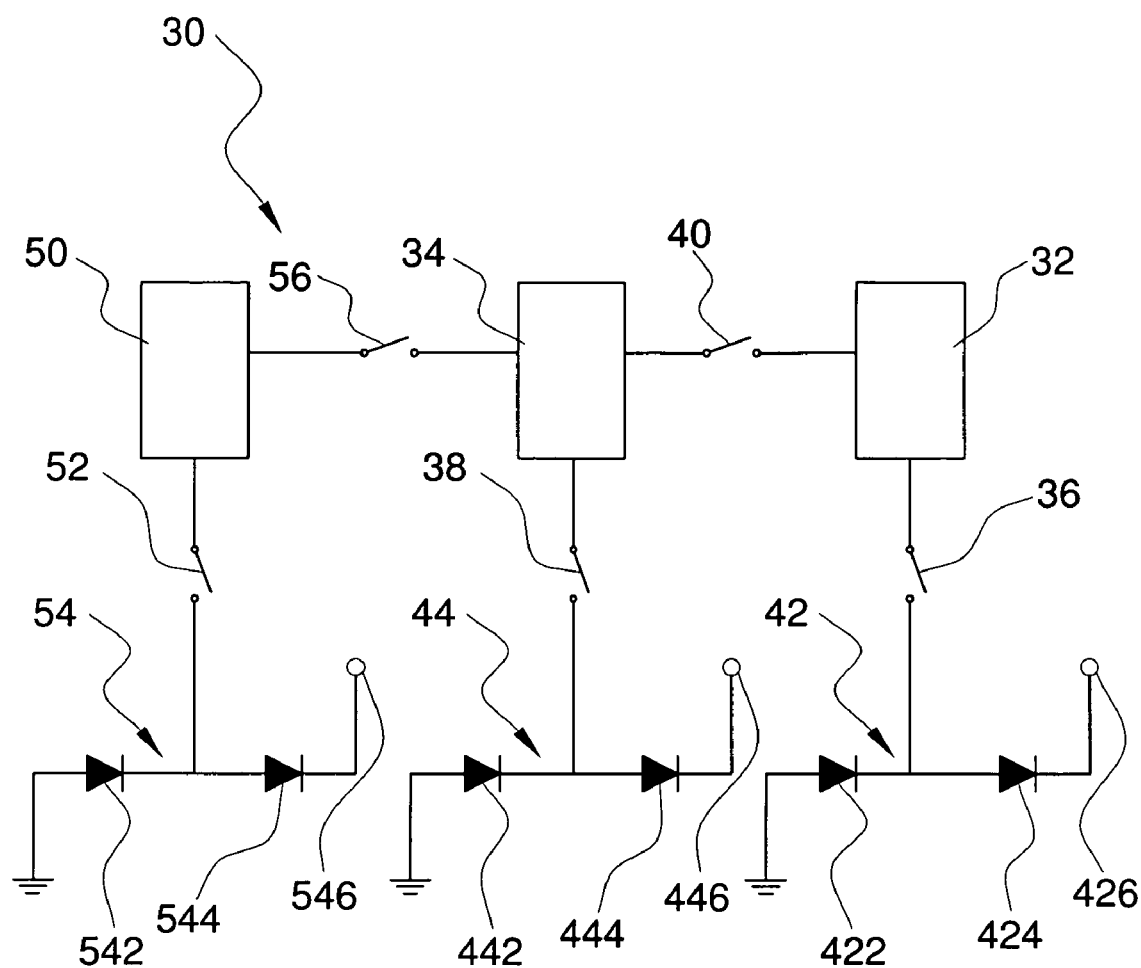
FIG. 7 shows a circuit according to another preferred embodiment of the present invention.

FIG. 7 shows a circuit according to another preferred embodiment of the present invention. The difference between FIG. 5 and FIG. 7 is that in FIG. 7, a third pad 50 is further tested. The first testing switch 36, the second testing switch 38, and the third testing switch 52 are coupled to the first testing circuit 42, the second testing circuit 44, and a third testing circuit 54, respectively. The circuit 30 in FIG. 7 further includes a second pad switch 56. The third testing circuit 54 includes a first diode 542, a second diode 544, and a third output terminal 546. The third testing switch 52 and the second pad switch 56 are transistors, respectively, such as MOSFETs. The second pad switch 52 is coupled between the second pad 34 and the third pad 50; the third testing switch 52 is coupled between the third pad 50 and the third testing circuit 54; one terminal of the first diode 542 is coupled to the ground; the third testing switch 52 is coupled between the first diode 542 and the second 544. Besides, another preferred embodiment of the first pad 31, the second pad 34, and the third testing circuit 54 according to the present invention can omit the second diode 544 described above. That is, the first diode 542 of the third testing circuit 54 is coupled between the output terminal 546 and the ground.

Figure 8:
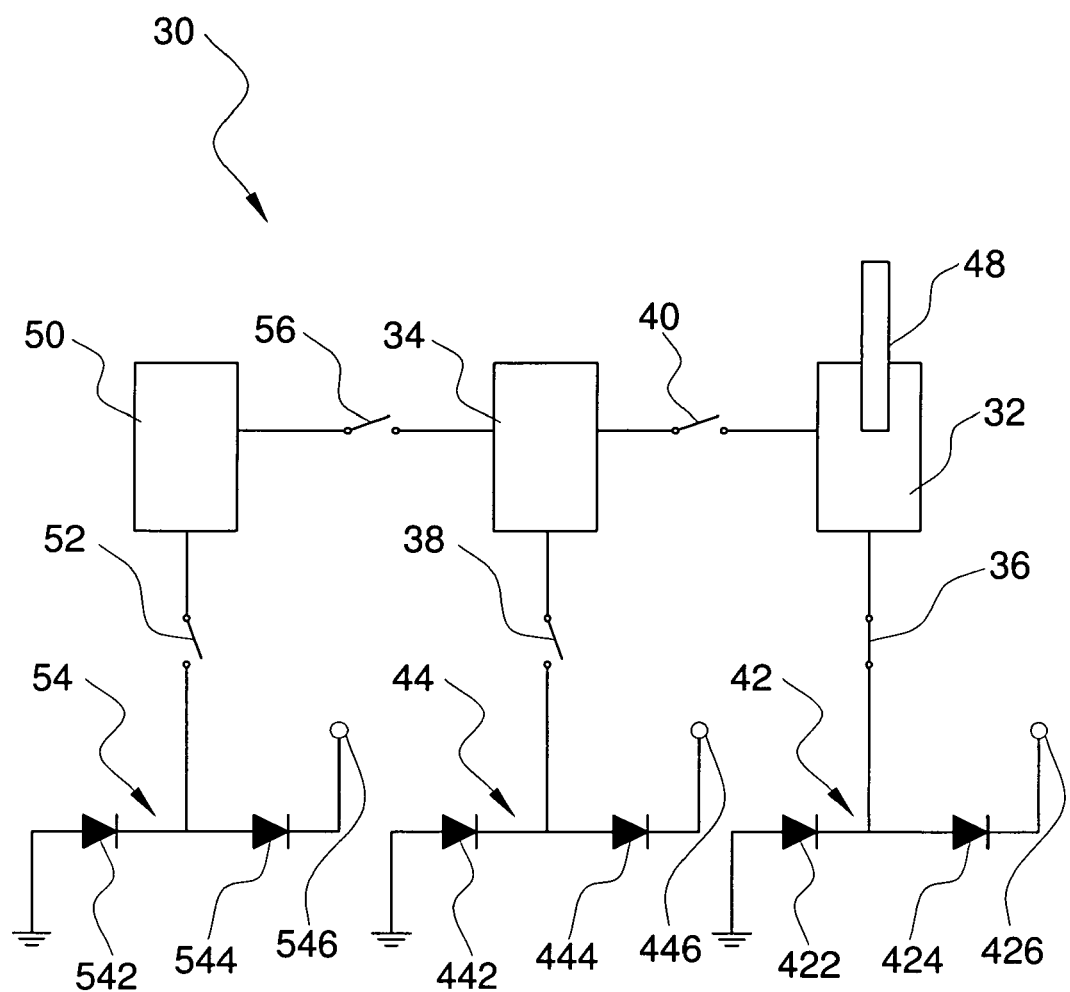
FIG. 8A shows a schematic diagram of testing the first pad of FIG. 7.
FIG. 8B shows a schematic diagram of testing the second pad of FIG. 7.
FIG. 8C shows a schematic diagram of testing the third pad of FIG. 7.
Figure 8:
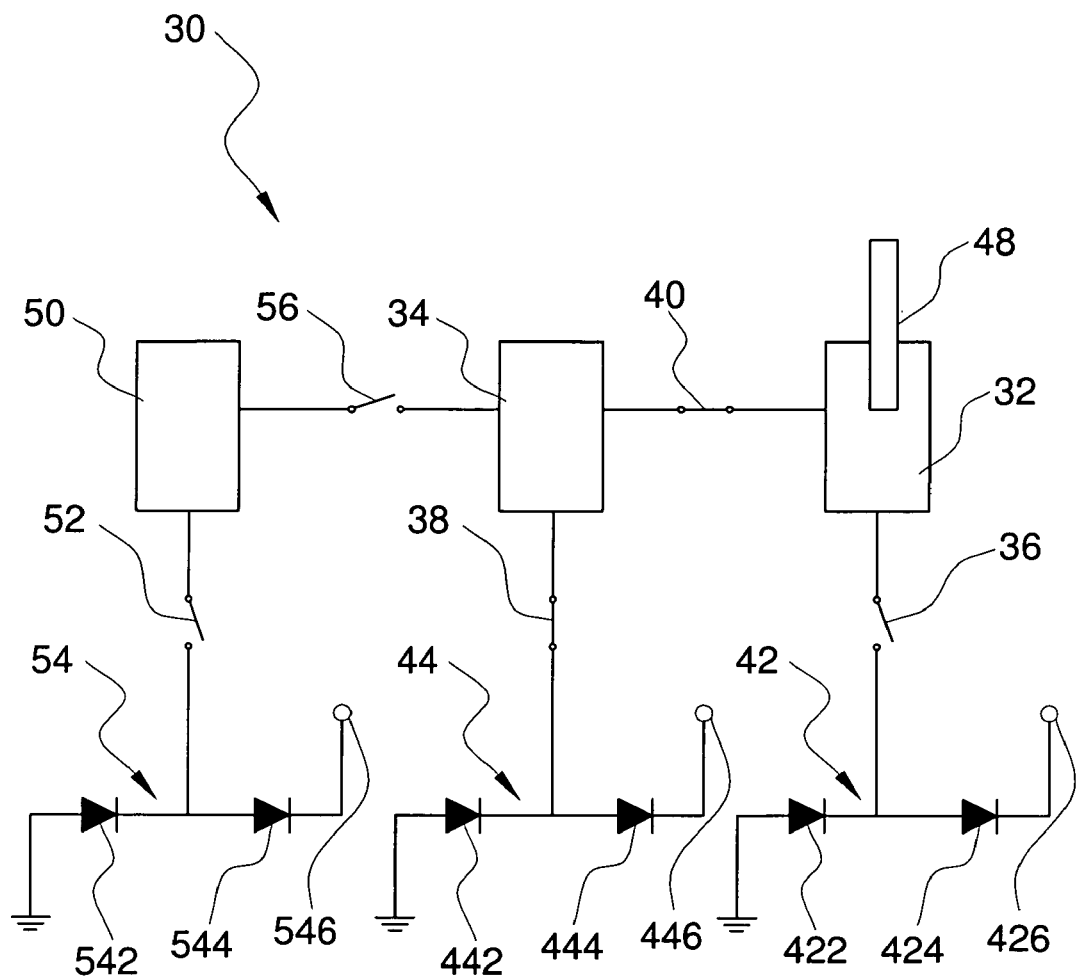
Figure 8:
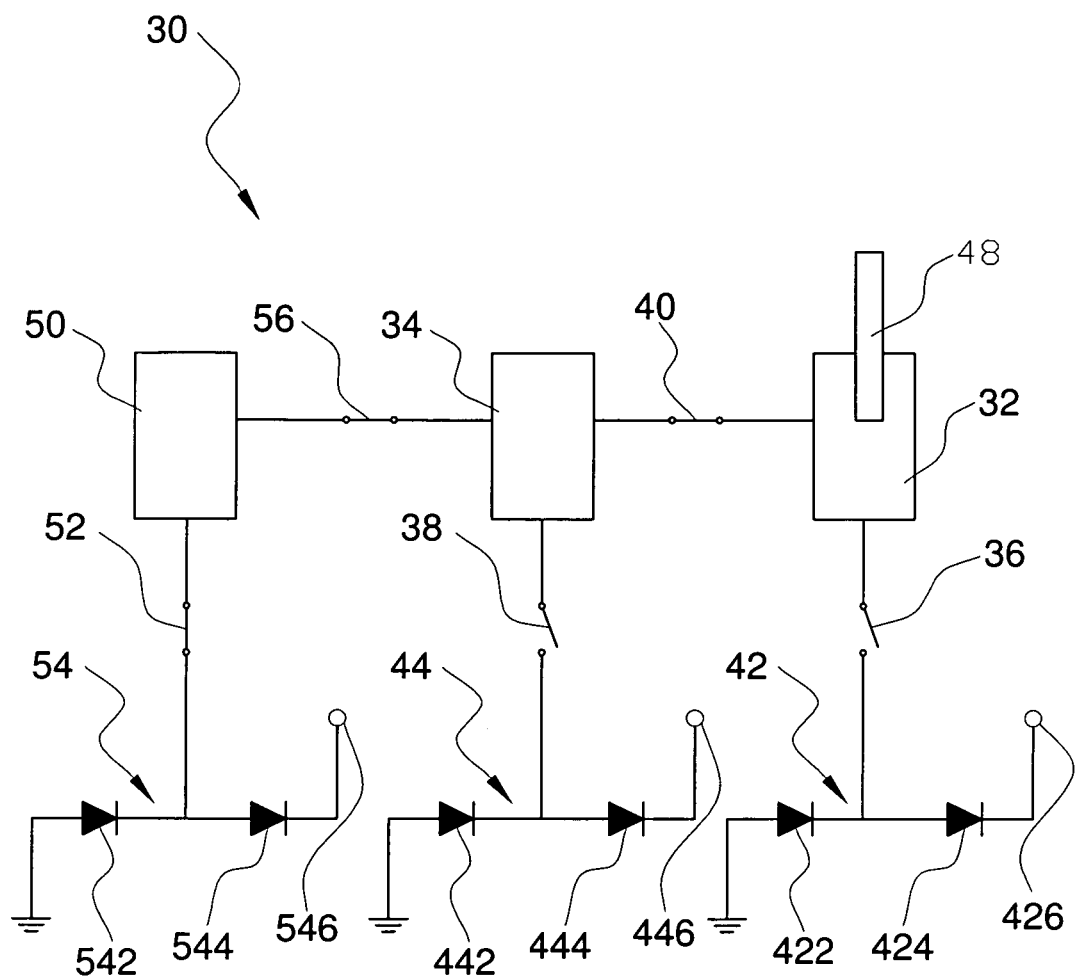

FIGS. 8A to 8C show schematic diagrams of testing the pads of FIG. 7. According to the present invention, the testing switches are turned on by turns, and the pad switches are turned on sequentially according to the corresponding testing switches. When the first pad 32 is tested, as shown in FIG. 9A, the testing probe 48 contacts the first pad 32, the first testing switch 36 is on, the second testing switch 38, the first pad switch 40, the second pad switch 56, and the third testing switch 52 are all off, and the testing signal will be transmitted to the first testing circuit 42 via the first pad 32 and the first testing switch 36. After the first pad in FIG. 9A is tested, the second pad 34 is tested. As shown in FIG. 9B, the testing probe 48 continues to be coupled with the first pad 32. At this time, the second testing switch 38 and the first pad switch 40 are on, and the first testing switch 36 and the third testing switch 52 are off. When the testing probe 48 contacts the first pad 32, the testing signal will be transmitted to the second testing circuit 44 via the first pad 32, the first pad switch 40, the second pad 34, and the second testing switch 38.

After the second pad is tested 34, the third pad 50 is tested. As shown in FIG. 9C, the testing probe 48 continues to be coupled with the first pad 32. At this time, the third testing switch 52, the first pad switch 40, and the second pad switch 56 are on, and the first testing switch 36 and the second testing switch 38 are off. The testing signal is transmitted to the third testing circuit 54 via the first pad 32, the first pad switch 40, the second pad 34, the second pad switch 56, the third pad 50, and the third testing switch 52. Thereby, tests on the first, second, and third pads 32, 34, 50 are completed by using only one testing probe. According to the present invention, the number of testing probes in a testing apparatus can be reduced to ⅓. In addition, if the testing apparatus is to measure tightly arranged pads, the tests can be done more easily without the issue of bad contacts.

Besides, the on/off of the testing switch 50 and the pad switch 56 described above are controlled by external commands, for example, by the testing machine, to the integrated circuit chip. This is a common testing technique, and will not be described in detail.

Figure 9:
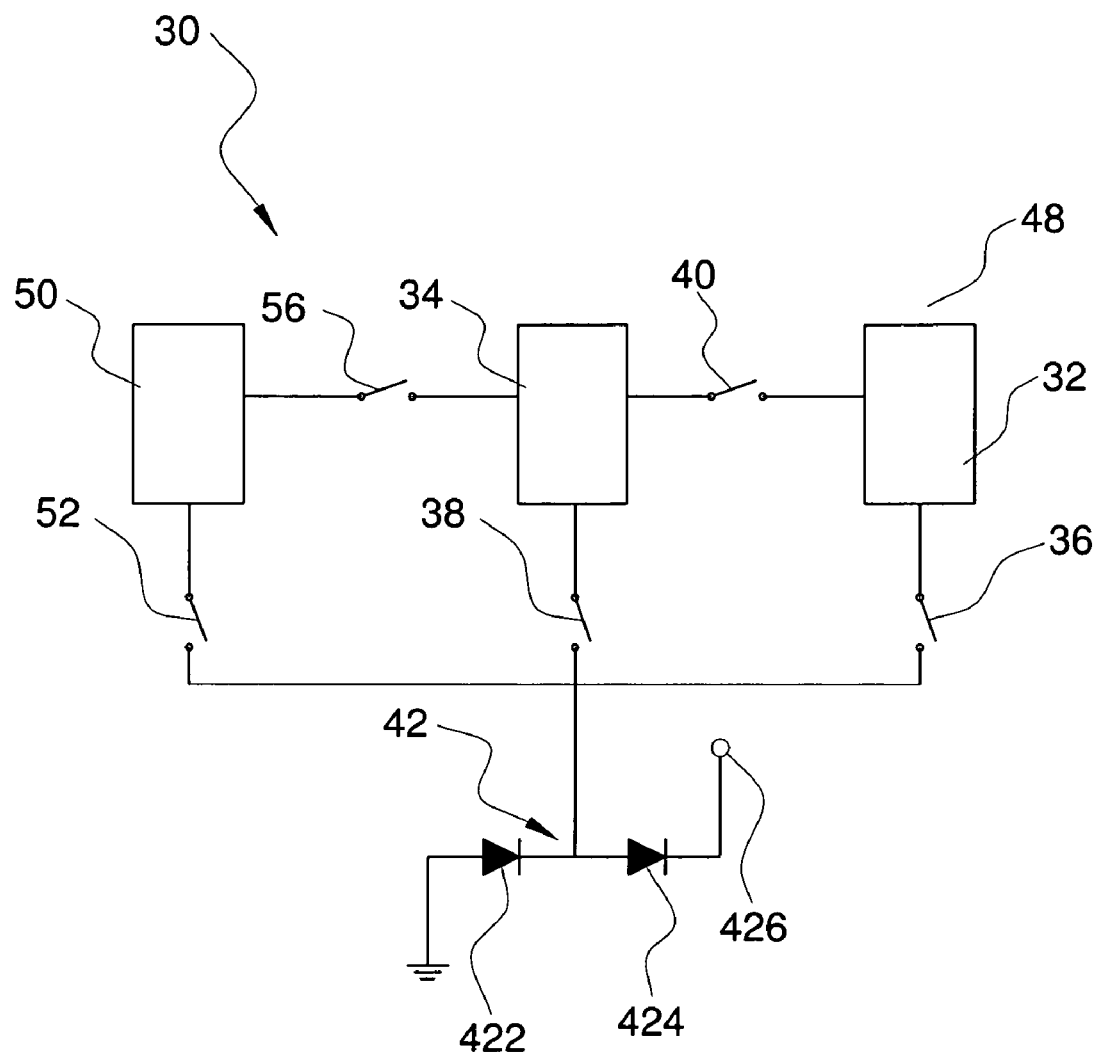
FIG. 9 shows a circuit according to another preferred embodiment of the present invention.
Figure 10:
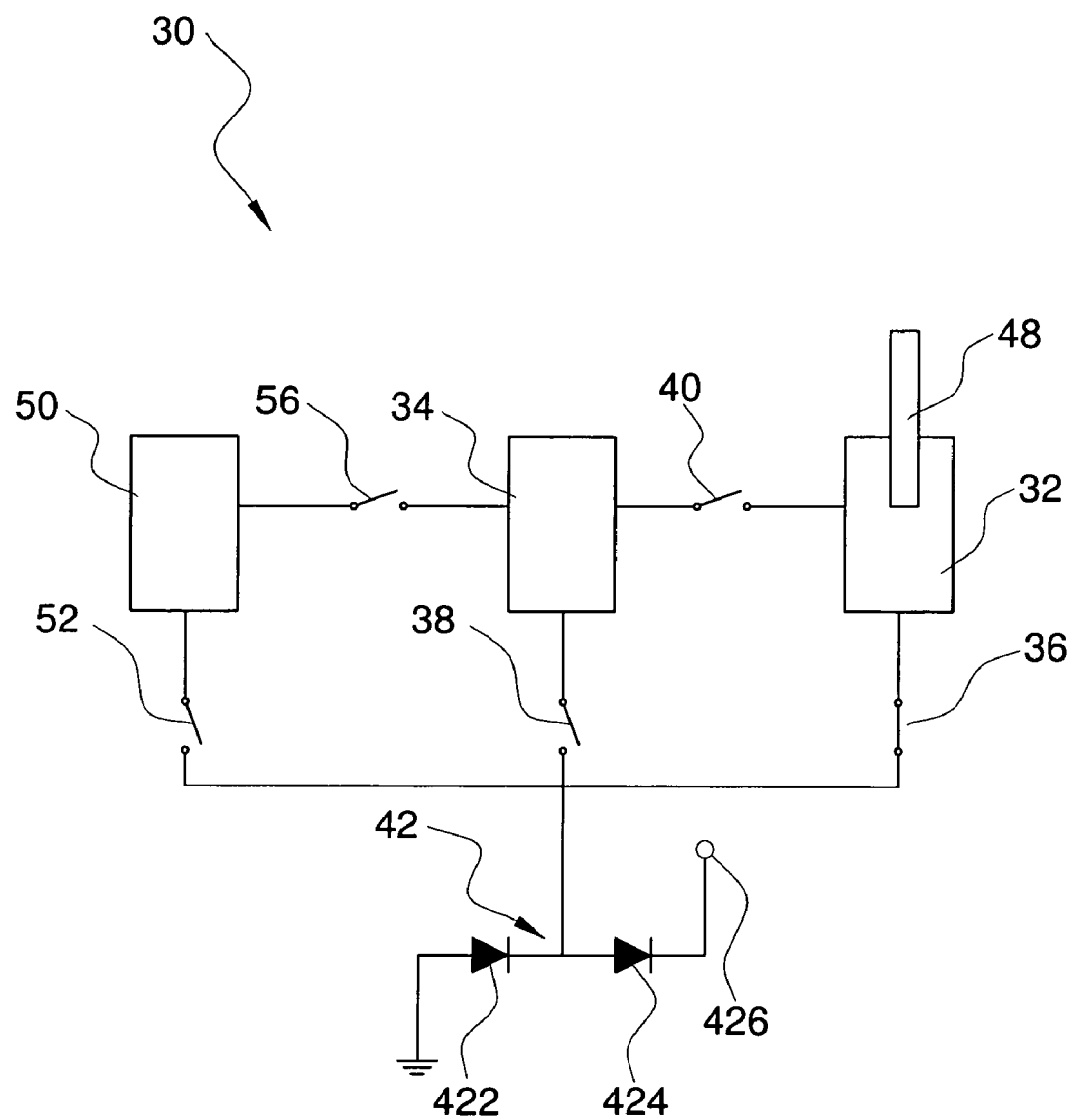
FIG. 10A shows a schematic diagram of testing the first pad of FIG. 9.
FIG. 10B shows a schematic diagram of testing the second pad of FIG. 9.
FIG. 10C shows a schematic diagram of testing the third pad of FIG. 9.
Figure 10:
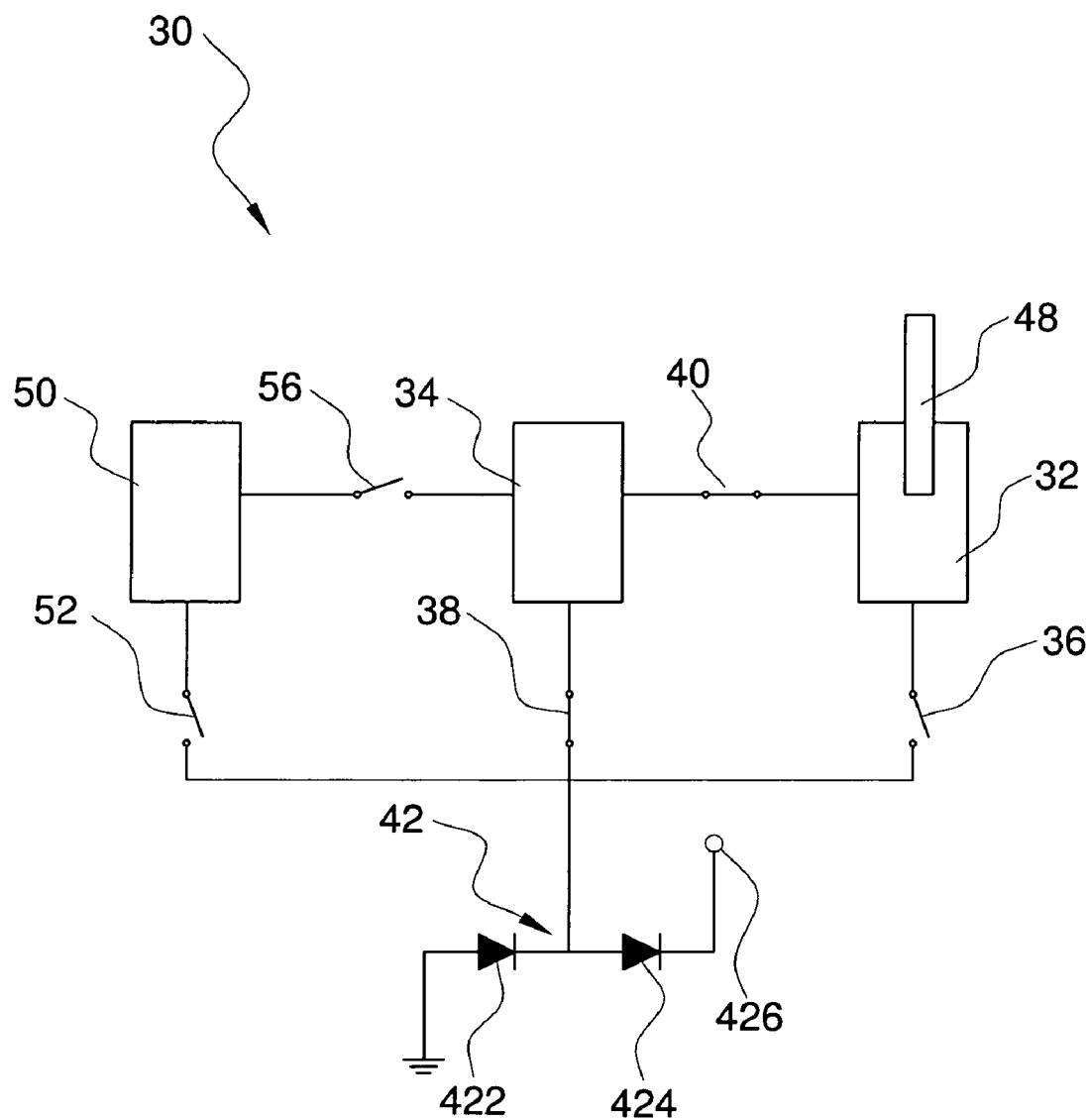
Figure 10:
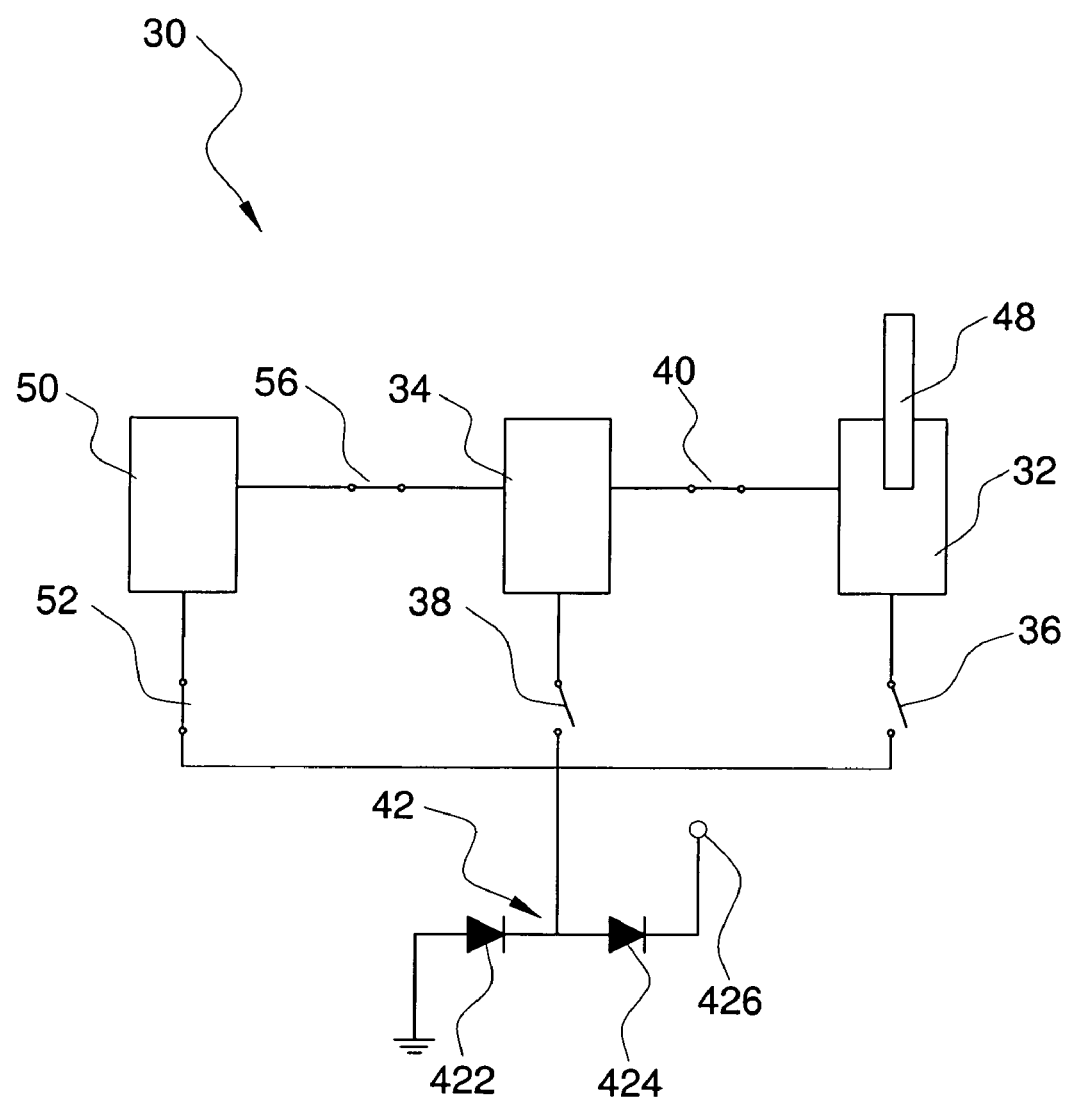

FIG. 9 shows a circuit according to another preferred embodiment of the present invention. The difference between FIG. 7 and FIG. 9 is that in FIG. 9, the circuit 30 combines the testing circuits for testing the first, second, and third pads 32, 34, 50. That is, the testing circuits are combined to the first testing circuit 42 to test the first, second, and third pads 32, 34, 50. In other words, the first, second, and third testing switches 36, 38, 52 are coupled to the first testing circuit 42. When the first pad is tested 32, as shown in FIG. 10A, the testing probe 48 is coupled to the first pad 32. At this time, the first testing switch 36 is on, and the first testing switch 36, the second testing switch 38, the first pad switch 40, the second pad switch 56, and the third testing switch 52 are off. The testing signal is transmitted to the first testing circuit 42 via the first pad 32 and the first testing switch 36. After the first pad is tested 32, the second pad 34 is tested subsequently. As shown in FIG. 10B, the testing probe 48 continues to be coupled with the first pad 32. The second testing switch 38 and the first pad switch 40 are on, and the first testing switch 36, the second pad switch 56, and the third testing switch 52 are off. The testing signal is transmitted to the second testing circuit 44 via the first pad 32, the first pad switch 40, the second pad 34, and the second testing switch 38.

After the second pad 34 is tested, the third pad 50 is tested subsequently. As shown in FIG. 10C, the testing probes 48 continues to be coupled with the first pad 32. At this time, the third testing switch 52, the first pad switch 40, and the second pad switch 56 are on, and the first testing switch 32 and the second testing switch 54 are off. The testing signal is transmitted to the third testing circuit 54 via the first pad 32, the first pad switch 40, the second pad 34, the second pad switch 56, the third pad 50, and the third testing switch 52. Thereby, according to the present invention, all pads of an integrated circuit chip are grouped into a plurality of connection port sets with three pads in each set. Because each connection port set is coupled only to a testing probe, and only one testing circuit is needed for each connection port set, the number of testing probes is reduced to ⅓. Besides, the area occupied by the testing circuits is reduced, thus reducing the cost.

According to the preferred embodiments described above, the present invention groups all pad of a single integrated circuit chip into a plurality of connection port sets. If each connect port set has M pads, then the circuit of each connection port set includes M−1 pad switches, M testing switches, and M testing circuits. The testing switches are coupled between the pads and the testing circuits, respectively. The pad switches are coupled between the pads, respectively. Thereby, each connection port set only needs one testing probe to test said M pads. The number of testing probes of the testing apparatus is reduced to 1/M for testing all the pads of the single integrated circuit chip. That is, the circuit according to the present invention makes the testing apparatus be able to us fewer amount of testing probes for testing all the pads of a single integrated circuit chip, thus reducing the cost. In addition, the plurality of testing circuits can be combined to one testing circuit, which is coupled to the plurality of testing switches for receiving the testing signal from the pads coupled with the plurality of testing switches, respectively, for testing the pads coupled with the plurality of testing switches, respectively. Consequently, the circuit according to the present invention reduces the area occupied by each connection port set, thus reducing more costs.

To sum up, the circuit for multi-pads test according to the present invention uses a plurality of testing switches coupled between a plurality of pads and one or more testing circuits, respectively, and a plurality of pad switches coupled between the plurality of pads. Thereby, by coordinating the testing switches and the pad switches, a single testing probe can be used to test the plurality of pads, reducing the number of testing probes for testing the plurality of pads of an integrated circuit chip. Hence, the testing apparatus for pads can be simplified, and a small amount of testing circuits can be used to test the pads. Consequently, the number of testing circuits is reduced, the area occupied by the testing circuits is reduced, and thus the cost is reduced.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A circuit for multi-pads test, used for testing a first pad and a second pad, comprising:
   one or more testing circuits;
   a first testing switch, coupled between the first pad and the testing circuit;
   a pad switch, coupled between the first pad and the second pad; and
   a second testing switch, coupled between the second pad and the testing circuit;
   when the first testing switch is on, the pad switch and the second testing switch are off;
   and when the pad switch is on, the first testing switch is off, and the second testing switch is on.

2. The circuit for multi-pads test of claim 1, wherein the first pad is further coupled with a testing probe of a plurality of testing probes of a testing apparatus, the testing probe transmitting a testing signal to the first pad, and the testing signal being transmitted to the testing circuit from the first pad via the first testing switch, or via the pad switch, the second pad, and the second testing switch.

3. The circuit for multi-pads test of claim 1, wherein the first pad, the first testing switch, the second testing switch, the second pad, the pad switch, and the testing circuit are set in an integrated circuit.

4. The circuit for multi-pads test of claim 1, wherein said one or more testing circuits comprise:
   a first testing circuit, coupled to the first testing switch; and
   a second testing circuit, coupled to the second testing switch.

5. The circuit for multi-pads test of claim 1, wherein the testing circuit comprises:
   an output terminal; and
   a diode, coupled between the ground and the output terminal.

6. The circuit for multi-pads test of claim 1, wherein the testing circuit comprises:
   a first diode, with one terminal coupled to the ground;
   a second diode, with one terminal coupled to the other terminal of the first diode; and
   an output terminal, coupled to the other terminal of the second diode.

7. The circuit for multi-pads test of claim 1, wherein the first testing switch and the second testing switch are transistors, respectively.

8. The circuit for multi-pads test of claim 1, wherein the pad switch is a transistors.

9. A circuit for multi-pads test, used for testing M pads, comprising:
   one or more testing circuits;
   M testing switches, coupled between the pads and the testing circuits, respectively; and
   M−1 pad switches, coupled between the pads, respectively;
   wherein M is greater than 2, one of the pads is further coupled with a testing probe of a plurality of testing probes of a testing apparatus, the testing probe transmits a testing signal to the pad coupled with the testing probe, and the testing signal is transmitted to the testing circuit from the pad coupled with the testing probe via the testing switch coupled with the pad, or via one or more pad switches, one or more pads, and another testing switch.

10. The circuit for multi-pads test of claim 9, wherein the pads, the testing switches, the pad switches, and the testing circuits are set in an integrated circuit.

11. The circuit for multi-pads test of claim 9, wherein said one or more testing circuits comprise M testing circuits, coupled to the testing switches, respectively.

12. The circuit for multi-pads test of claim 9, wherein the testing circuits comprise:
   an output terminal; and
   a diode, coupled between the ground and the output terminal.

13. The circuit for multi-pads test of claim 9, wherein the testing circuits comprise:
   a first diode, with one terminal coupled to the ground;
   a second diode, with one terminal coupled to the other terminal of the first diode; and
   an output terminal, coupled to the other terminal of the second diode.

14. The circuit for multi-pads test of claim 9, wherein the testing switches are transistors.

15. The circuit for multi-pads test of claim 9, wherein the pad switches are transistors.

* * * * *